United States Patent [19]
Era et al.

[11] Patent Number: 5,414,279
[45] Date of Patent: May 9, 1995

[54] CBN SEMICONDUCTOR DEVICE HAVING AN OHMIC ELECTRODE AND A METHOD OF MAKING THE SAME

[75] Inventors: Koh Era, Tsukuba; Yoshiyuki Suda, Koganei; Satoshi Agawa, Omiya; Osamu Mishima, Tsukuba, all of Japan

[73] Assignee: National Institute for Research in Inorganic Materials, Tsukuba, Japan

[21] Appl. No.: 124,754

[22] Filed: Sep. 22, 1993

[30] Foreign Application Priority Data

Sep. 28, 1992 [JP] Japan .................. 4-282444

[51] Int. Cl.6 ............... H01L 23/48; H01L 29/46; H01L 29/62; H01L 29/64
[52] U.S. Cl. .................. 257/76; 257/745; 257/763
[58] Field of Search ............ 257/76, 743, 744, 764, 257/77, 78, 763, 745

[56] References Cited

U.S. PATENT DOCUMENTS 5,057,454 10/1991 Yoshida et al. .............. 437/184
5,187,560 2/1993 Yoshida et al. .............. 257/76

*Primary Examiner*—William D. Larkins
*Assistant Examiner*—S. V. Clark
*Attorney, Agent, or Firm*—Oblon, Spivak, McClelland, Maier & Neustadt

[57] ABSTRACT

An ohmic electrode is formed on a cBN crystal to form a cBN semiconductor device which is used as a solid electronic element. The cBN semiconductor device may be of an n-type, a p-type or a pn junction type wherein molybdenum is deposited onto an n-type doped region of the cBN crystal or platinum is deposited onto a p-type doped region to thereby form an electrode with ohmic characteristic. The deposition of the molybdenum or the platinum is conducted by using a vapor deposition method followed by heating the attached substance at a temperature of 300° C.–1100° C. in an inactive gas atmosphere. The cBN semiconductor device can be used as a solid electronic element or an optoelectronic element for rectifiers, transistors, light emitting diodes and so on and integrated elements thereof.

6 Claims, 5 Drawing Sheets

TO EVACUATION SYSTEM

COOLING WATER 5,414,279

CBN SEMICONDUCTOR DEVICE HAVING AN OHMIC ELECTRODE AND A METHOD OF MAKING THE SAME

BACKGROUND OF THE INVENTION

1. Field of the Invention

The present invention relates to a cBN (cubic boron nitride) semiconductor device. More particularly, it relates to a technique of forming an ohmic electrode on a cBN semiconductor device of an n-type, a p-type or a pn junction type. The cBN semiconductor device is used as a solid electronic element, an optoelectronic element for rectifiers, transistors, light emitting diodes and so on and integrated elements thereof.

2. Discussion of Background cBN is a semiconductor material having an indirect gap which is considered to be about 6.3 eV, and it is possible to form a pn junction, whereby the device can be used as a rectifier element or a light emitting diode. However, there has not been exemplified that an electrode attached to a cBN crystal of a p-type or an n-type shows an ohmic property. Nevertheless, a silver paste has been used for the cBN as an electrode in spite of its non-ohmic characteristic. Although there is a report wherein Ti is used for an electrode, it has not been shown that a Ti electrode has ohmic characteristic.

SUMMARY OF THE INVENTION

It is an object of the present invention to provide a method of forming an ohmic contact necessary for using cBN as a solid electronic element.

The inventors of this application have made extensive study to form an ohmic electrode by depositing platinum to a p-type cBN and molybdenum to an n-type cBN at room temperature followed by annealing them at a high temperature. The successful formation of the ohmic electrodes has been confirmed by measuring the current-voltage characteristic of them. The inventors have tested several kinds of metal other than the above-mentioned material, and have found that only the above-mentioned metals show the ohmic characteristic.

In accordance with the present invention, there is provided a cBN semiconductor device of an n-type, a p-type or a pn junction type comprising a cBN crystal wherein molybdenum is deposited to form an ohmic contact electrode to an n-type doped region of the cBN crystal or platinum is deposited to form an ohmic contact electrode to a p-type doped region of the cBN crystal.

Further, in accordance with the present invention, there is provided a method of making a cBN semiconductor device of an n-type, a p-type or a pn junction type which comprises vapor deposited molybdenum to an n-type doped region of a cBN crystal or vapor deposited platinum to a p-type doped region of the cBN crystal, and effecting the ohmic contact of the molybdenum or the platinum deposit by a heat treatment at a temperature of 300° C.–1100° C. in an inert gas atmosphere to thereby form an ohmic electrode.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
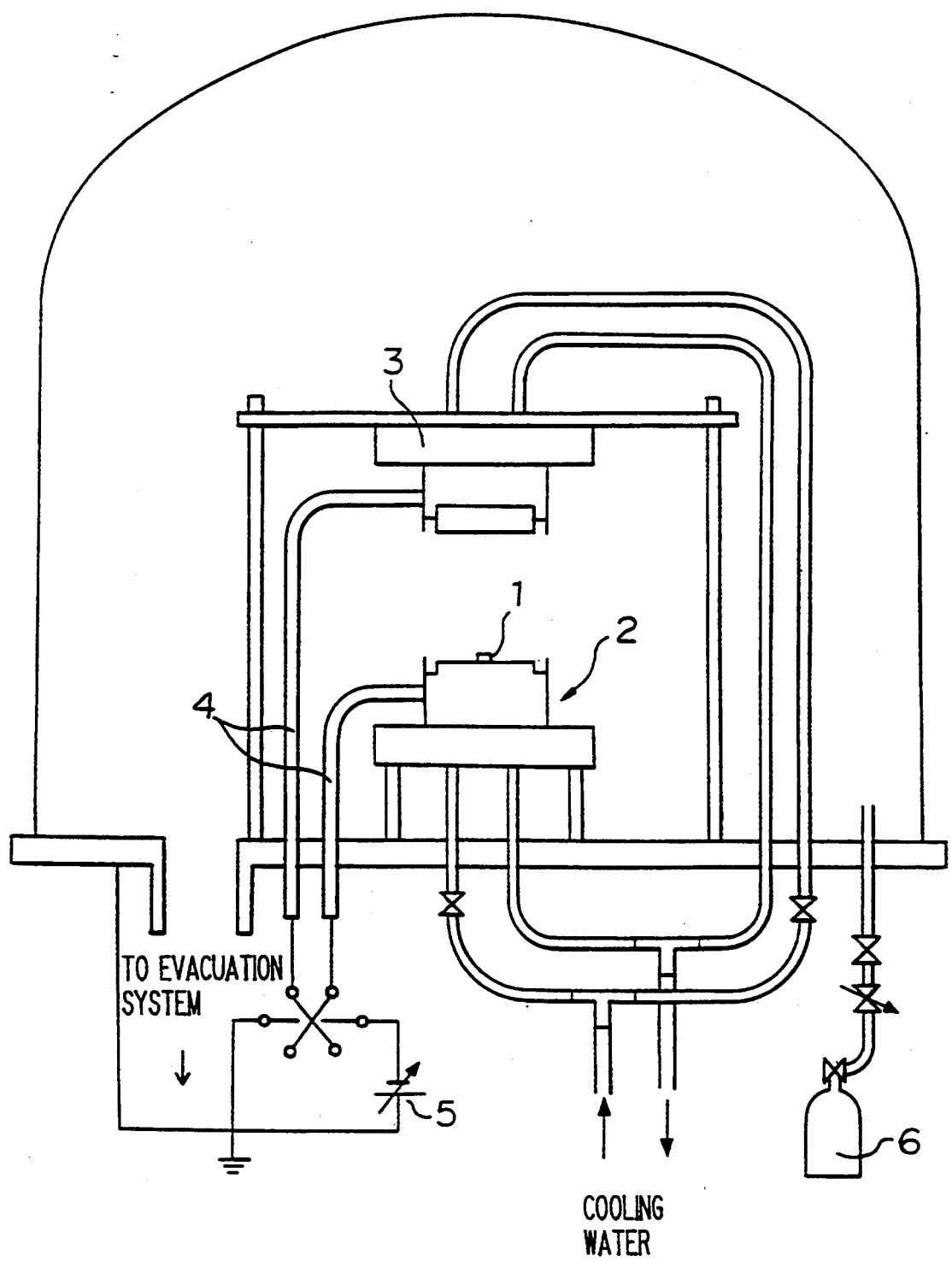
FIG. 1 is a schematic view showing a two-pole d.c. sputtering apparatus.

Referring to the drawings, preferred embodiments of the present invention will be described in more detail.

An n-type, a p-type or a pn junction type cBN semiconductor is used as a sample. The surface of the sample is cleaned in a pretreatment. Normally, the sample is boiled in diluted hydrochloric acid for about: 30 minutes, and then, it is subjected to ultrasonic cleaning in the diluted hydrochloric acid just before vapor deposition. The cBN semiconductor may be of a single crystal, a sintered +body, a thin film or another form.

For the metal for an electrode, molybdenum is used for the n-type cBN semiconductor, and platinum is used for the p-type cBN semiconductor. The material is deposited to the semiconductor by a vapor deposition method. The vapor deposition method is not particularly limited as far as an apparatus capable of vapor depositing metal for an electrode is used.

Figure 2:
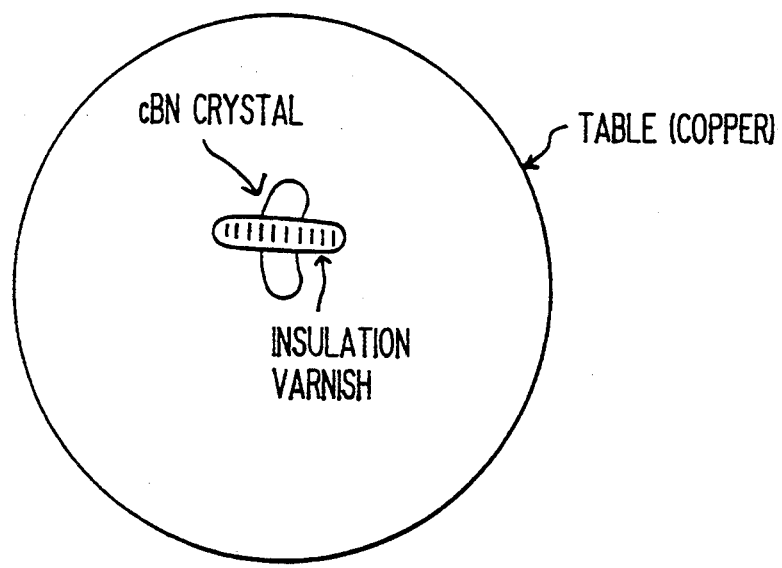
FIG. 2 is a plane view showing how the vapor deposition is conducted in the sputtering apparatus.
Figure 3:
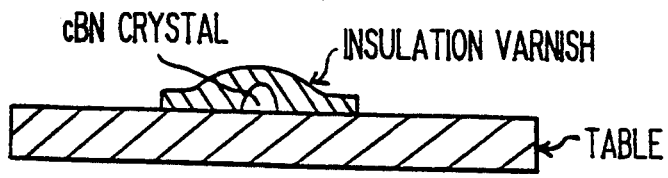
FIG. 3 is a cross-sectional view showing how the vapor deposition is conducted in the sputtering apparatus.

When a sputtering method as a typical vapor deposition method is conducted, a two-pole d.c. sputtering apparatus as shown in FIG. 1 can be used, for instance. In this case, a sample (a cBN crystal) is fixed onto an anode with insulating varnish. The varnish is applied to the crystal so as to traverse the surface of the crystal so that the measurement of the voltage-current characteristic can be easily conducted thereafter (FIGS. 2 and 3). A circular disk having a diameter of 15 mm, made of metal for forming an electrode which is to be vapor-deposited, is held on a cathode which is placed at a position of 5 mm–100 mm from the lower part, normally at a position of 10 mm–15 mm from the lower part. The sputtering apparatus holding the sample and the metal for an electrode is set in a vacuum vessel. In the vacuum vessel, it is placed for about 1 hour under about $10^{-6}$ Torr, and then, highly purified argon gas is introduced in the vacuum vessel to adjust a degree of vacuum to about $10^{-2}$ Torr. Then, a voltage of 1–5 kV, typically, 2–3 kV is applied across the upper and lower electrodes, with the result that a current of 0.5 mA–10 mA, typically about 5 mA flows. Maintaining the sample in the situation for 30–60 minutes, a metalescent surface is found on the sample.

After the metal for an electrode has been attached to the sample by the vapor deposition, a high temperature annealing method is conducted so that the metal is made in ohmic contact to the cBN semiconductor.

In the high temperature annealing, the sample is heated to 300° C.–1100° C. in the atmosphere of inert gas such as argon. For instance, the sample is heated in the highly purified argon gas in a temperature range from 300° C. to about 1100° C., usually 500° C., at which the phase transformation of cBN is caused, for about 10 minutes–30 minutes.

When only the vapor deposition is conducted, the voltage-current characteristic doesn't exhibit a linear line. However, when the above-mentioned high temperature annealing is conducted, a linear voltage-current characteristic can be found in a range of +5 V–−5 V and in a further range. From the linear voltage-current characteristic, the formation of an ohmic electrode can be easily confirmed.

The crystal used for the above-mentioned test is of an irregular crystalline structure wherein the span in cross section or the length of two sides is about 0.3 mm–about 2 mm. According to the present invention, however, the performance of the electrode can be realized in cBN crystal in various forms and dimensions.

Several Examples of the present invention will be described. However, the present invention is not limited to the Examples.

EXAMPLE 1

A p-type cBN semiconductor crystal was used.

Platinum was used as metal for an electrode to be vapor-deposited by sputtering. The metal was vapor-deposited on the p-type cBN semiconductor crystal in the sputtering apparatus shown in FIG. 1.

Figure 4:
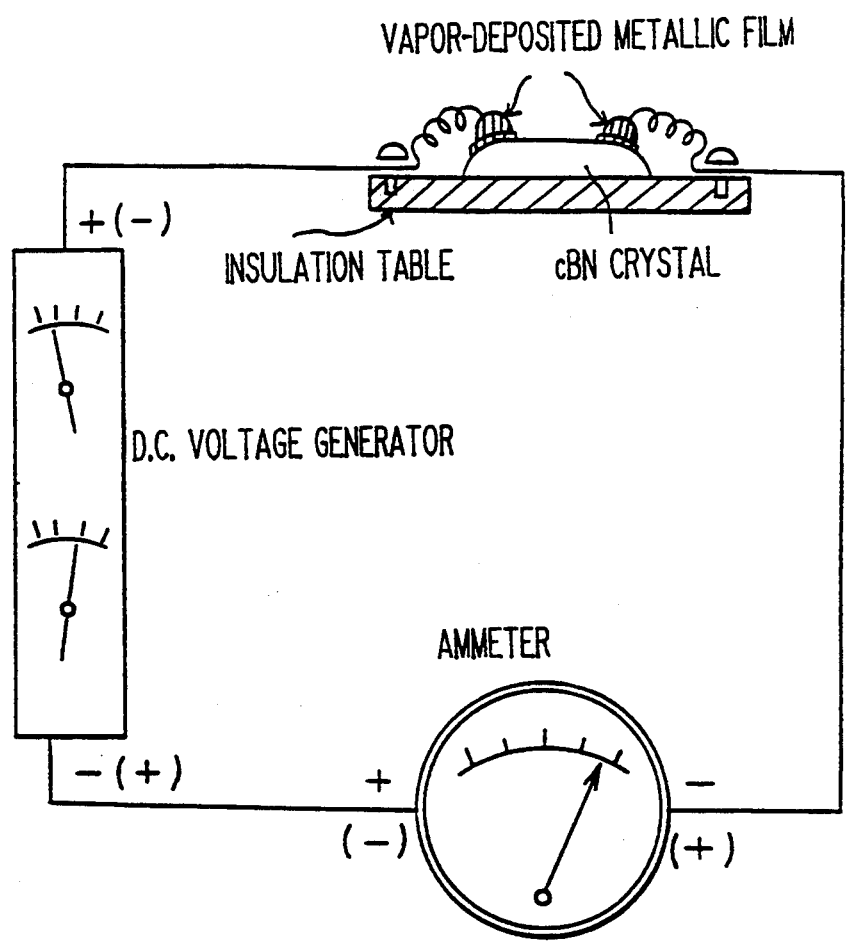
FIG. 4 is a schematic view showing an example of a circuit for measuring voltage-current characteristics.
Figure 5:
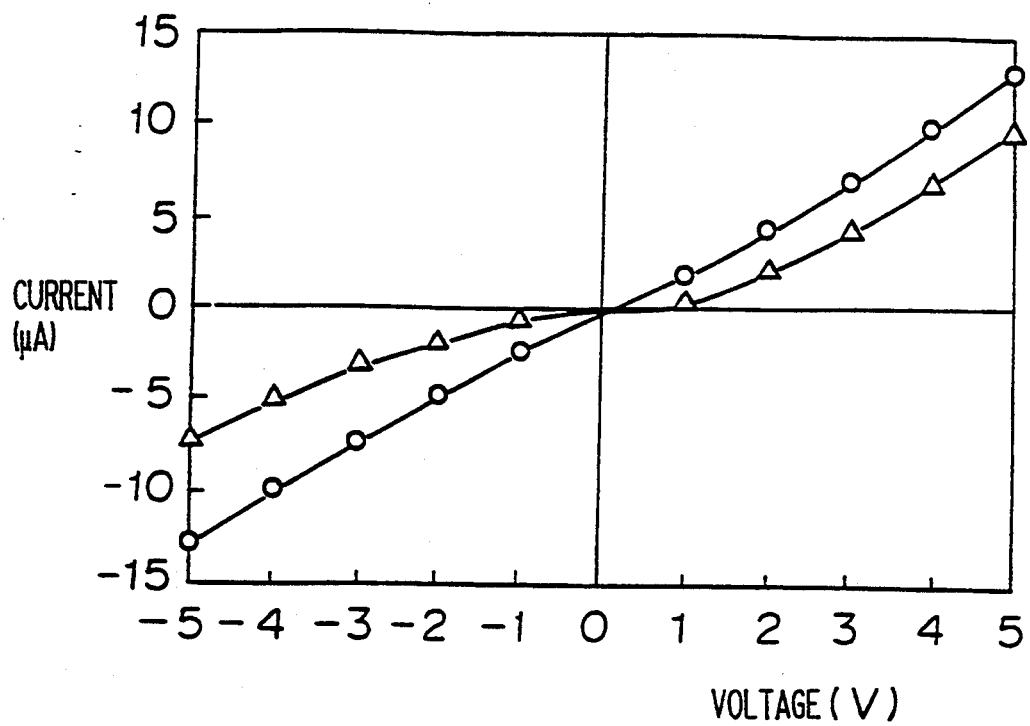
FIG. 5 is a diagram showing the voltage-current characteristic of a p-type cBN semiconductor crystal onto which platinum (metal for an electrode) is deposited according to Example 1 wherein a mark Δ shows a case of vapor deposition only, and a mark ◯ shows a case that a high temperature annealing treatment is conducted after the vapor deposition.

A small stream of highly purified argon gas was introduced in the sputtering apparatus and the apparatus was heated to 500° C. for 30 minutes. Then, the voltage-current characteristic of the semiconductor crystal was measured in the manner as in FIG. 4. A result is shown in FIG. 5. A mark △ shows a case that the sample is only vapor-deposited, and the voltage-current characteristic is not linear, namely, the metal is not in ohmic contact. On the other hand, the sample marked by ◯ which is annealed at a high temperature shows a substantially linear line, and the resistance including the crystal is about 400 kΩ, whereby the formation of an electrode of ohmic contact is confirmed.

Figure 6:
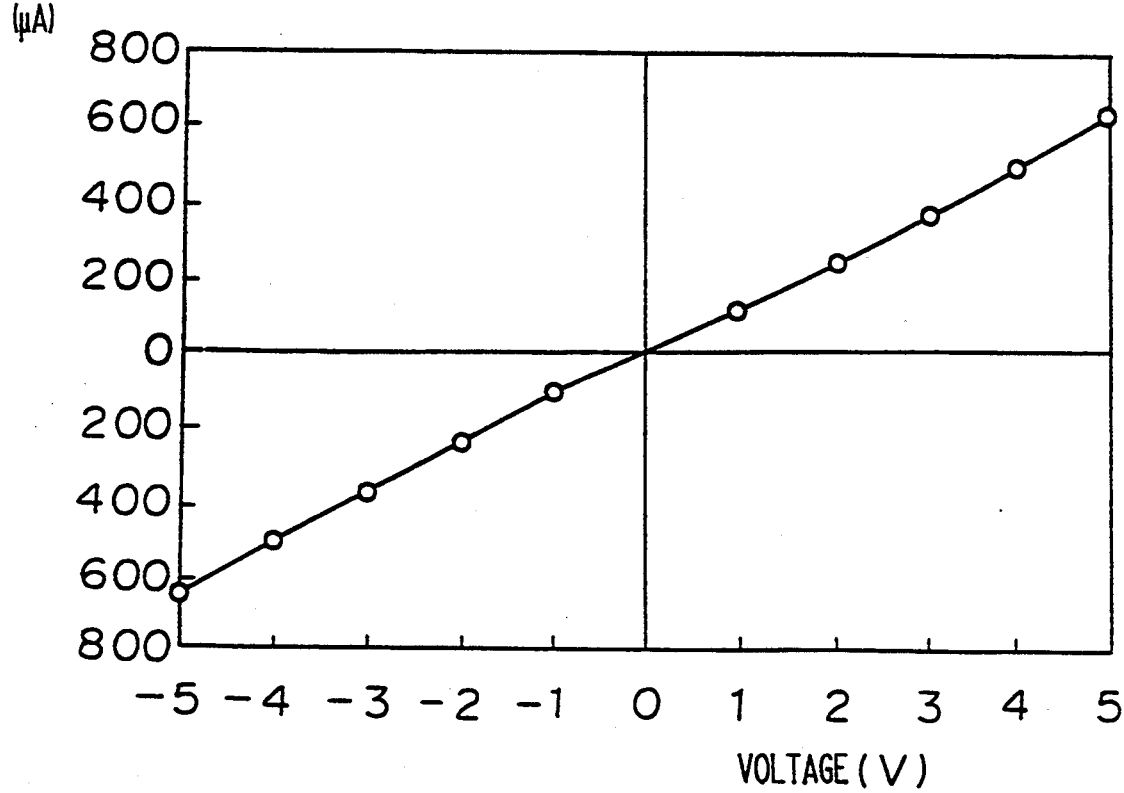
FIG. 6 is a diagram showing the voltage-current characteristic of another p-type cBN semiconductor crystal on which platinum (metal for an electrode) is vapor-deposited followed by a high temperature annealing treatment in Example 1.

FIG. 6 shows an example of using another p-type cBN semiconductor crystal, which also shows a linear line, and the whole resistance is about 9 kΩ.

EXAMPLE 2

An n-type cBN semiconductor crystal was used.

Figure 7:
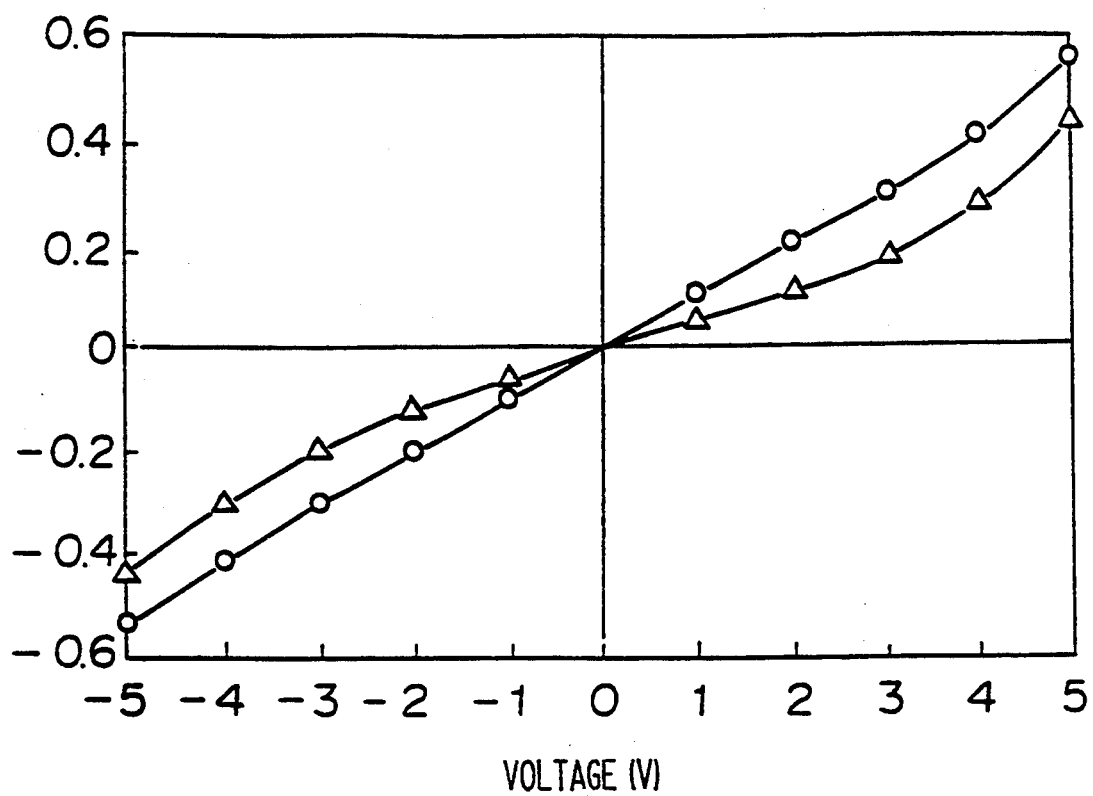
FIG. 7 is a diagram showing the voltage-current characteristic of an n-type cBN semiconductor crystal on which molybdenum (metal for an electrode) is vapor-deposited followed by a high temperature annealing treatment in Example 2.

Molybdenum was used as metal for an electrode to be vapor-deposited by sputtering. The metal was vapor-deposited on the n-type cBN semiconductor crystal and the high temperature annealing was conducted in the same manner as Example 1. The voltage-current characteristic was measured. FIG. 7 shows a result. In FIG. 7, a mark △ shows the sample of only vapor deposition, and a mark ◯ shows the sample treated by high temperature annealing. From FIG. 7, it is found that the semiconductor shows a substantially linear voltage-current characteristic by the treatment of high temperature annealing after the vapor deposition. The whole resistance is about 900 kΩ. In this case, the formation of the electrode having-ohmic contact can be confirmed.

In accordance with the present invention, an ohmic electrode can be formed on a cBN semiconductor. Accordingly, the present invention can satisfy one of the conditions necessary for using practically cBN as electronic or optoelectronic solid elements.

Obviously, numerous modifications and variations of the present invention are possible in light of the above teachings. It is therefore to be understood that within the scope of the appended claims, the invention may be practiced otherwise than as specifically described herein.

What is claimed is:

1. A cBN semiconductor device of an n-type comprising a cBN crystal having an n-type doped region and an ohmic electrode consisting essentially of molybdenum deposited directly thereon.

2. A cBN semiconductor device of a p-type comprising a cBN crystal having a p-type doped region and an ohmic electrode consisting essentially of platinum deposited directly thereon.

3. A cBN semiconductor device of the pn junction type having p and n type doped regions comprising a cBN crystal having ohmic electrodes selected from the group consisting of platinum and molybdenum deposited directly thereon, the ohmic electrode attached to the p-portion of the pn-junction, consisting essentially of platinum, and the ohmic electrode attached to the n portion of the pn-junction consisting essentially of molybdenum.

4. The cBN semiconductor device of claim 1 wherein said device, after attachment of said molybdenum, has been subjected to annealing at a temperature of 300° C. to 1100° C. in an inert atmosphere.

5. The cBN semiconductor device of claim 2 wherein said device, after attachment of said platinum, has been subjected to annealing at a temperature of 300° C. to 1100° C. in an inert atmosphere.

6. The cBN semiconductor device of claim 3 wherein said device, after attachment of said molybdenum and platinum, has been subjected to annealing at a temperature of 300° C. to 1100° C. in an inert atmosphere.

* * * * *